(12) United States Patent
Rauhala et al.

(10) Patent No.: US 6,327,153 B2
(45) Date of Patent: *Dec. 4, 2001

(54) COVER STRUCTURE FOR A WIRELESS COMMUNICATION DEVICE AND METHOD IN ITS MANUFACTURE AS WELL AS A WIRELESS COMMUNICATION DEVICE

(75) Inventors: Jyri Rauhala, Tampere; Timo Herranen, Viiala, both of (FI)

(73) Assignee: Nokia Mobile Phones Ltd., Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/158,692

(22) Filed: Sep. 22, 1998

(30) Foreign Application Priority Data

Sep. 23, 1997 (FI) .................................................. 973757

(51) Int. Cl.⁷ .............................. H05K 5/02; H05K 9/00; G06F 1/16
(52) U.S. Cl. ........................ 361/737; 361/753; 361/800; 361/818; 174/35 R; 211/41.17
(58) Field of Search ..................................... 361/736, 737, 361/752, 753, 801–802, 818, 800; 439/946; 235/492; 257/679; 174/35 R; 211/41.17; 206/706, 719

(56) References Cited

U.S. PATENT DOCUMENTS

| | | | |
|---|---|---|---|
| 4,459,679 | 7/1984 | Sukeda et al. | 365/1 |
| 4,945,633 | 8/1990 | Hakanen et al. | 29/825 |
| 5,031,076 | * 7/1991 | Kiku | 361/816 |
| 5,036,432 | 7/1991 | Uronen et al. | 361/422 |
| 5,045,973 | 9/1991 | Saarela et al. | 361/395 |
| 5,333,100 | * 7/1994 | Anhalt et al. | 361/818 |
| 5,481,434 | * 1/1996 | Banakis et al. | 361/756 |
| 5,563,772 | 10/1996 | Nichols | 361/752 |
| 5,568,364 | 10/1996 | Madden | 361/752 |
| 5,712,766 | * 1/1998 | Feldman | 361/737 |
| 5,721,669 | * 2/1998 | Becker et al. | 361/685 |
| 5,846,092 | * 12/1998 | Feldman et al. | 439/76.1 |
| 5,894,167 | * 4/1999 | Moden et al. | 257/679 |
| 5,999,416 | * 12/1999 | McAnally et al. | 361/816 |

\* cited by examiner

Primary Examiner—Jayprakash N. Gandhi
(74) Attorney, Agent, or Firm—Perman & Green, LLP

(57) ABSTRACT

The present invention relates to a cover structure for a wireless communication device arranged at least partly as a standard expansion card, and the cover structure (3) being provided with at least one cover surface (3a, 3b). The cover surface (3a, 3b) is provided with at least one elongated bracing groove (G1 to G3) for increasing the dimensional stability of the cover surface (3a, 3b, 4a, 4b, 4c). In an advantageous embodiment of the cover structure (3), the thickness of the cover structure (3) at the bracing groove corresponds substantially to the thickness of the cover structure (3) at the cover surface (3a, 3b), and the bracing groove (G1 to G3) extends substantially over the cover surface (3a, 3b) and the depth of the bracing groove (G1 to G3) is smaller than the thickness of the cover structure (3) at the cover surface (3a, 3b). The present invention relates also to a method in the manufacture of the cover structure for a wireless communication device. The present invention relates further to a wireless communication device which is arranged at least partly as a standard expansion card and comprises at least one cover structure (3) provided with at least one cover surface (3a, 3b). In an advantageous embodiment of the wireless communication device, the bracing groove (G1 to G3) is arranged transverse to the longitudinal axis of the wireless communication device.

7 Claims, 5 Drawing Sheets

COVER STRUCTURE FOR A WIRELESS COMMUNICATION DEVICE AND METHOD IN ITS MANUFACTURE AS WELL AS A WIRELESS COMMUNICATION DEVICE

BACKGROUND OF THE INVENTION

The present invention relates to a cover structure for a wireless communication device arranged at least partly as a standard expansion card, and the cover structure being provided with at least one cover surface. The invention relates also to a method in the manufacture of a cover structure for a wireless communication device arranged at least partly as a standard expansion card, and wherein the cover structure is provided with at least one cover surface. The invention relates further to a wireless communication device arranged at least partly as a standard expansion card and comprising at least one cover structure provided with at least one cover surface.

According to prior art, for example portable personal computers (PC) are often provided with an expansion card interface in which a standard expansion card can be linked. These expansion cards have a size and shape of nearly a credit card, and they are intended for forming a functional unit with the PC. Such expansion cards include memory cards (RAM and ROM cards), modem cards and various input/output cards (I/O cards) as well as hard disk cards. Expansion cards can also contain a transmitter/receiver with its antenna for radio communication, wherein the PC can, by means of this card-like wireless communication device, be in a data transmission connection with other devices or with a data communication network, such as a local area network (LAN).

One known expansion card is a PC card according to the PCMCIA (Personal Computer Memory Card International Association) standard. The PCMCIA standard defines also the physical size of the PC card, wherein according to the PCMCIA standard the length of the PC card is 85.6 mm and the width is 54 mm. PC cards are further divided into three types, wherein the thickness of the PC card can be 3.3 mm (type I), 5.0 mm (type II) or 10.5 mm (type III). PC cards are arranged to be inserted entirely inside the PC, but so-called extended PC cards can be even 40 mm longer than regular PC cards. These extended PC cards are placed partly outside the PC, wherein the thickness and shape of the PC cards can vary in this projecting part outside the PC. This part can be used for example for the placement of the antenna of the wireless communication device.

One known card-like wireless communication device comprising a transmitter/receiver with its antenna is Nokia Cellular Card Phone, i.e. a card phone which can be coupled to expansion card interfaces of types II and III of the PC card according to the PCMCIA standard. This card phone can be for example a mobile station (MS) according to the GSM (Global System for Mobile Communication) standard, wherein the PC in which the card phone is installed can be in wireless data transmission connection with base stations (BS) of a public land mobile network (PLMN) by means of radio waves.

To secure the undisturbed function of components, such as integrated circuits (IC), arranged inside the card-like wireless communication device, usually on a circuit board, they must be protected from interference caused e.g. by the electromagnetic field of the antenna, such as induced disturbance signals. Malfunctions can also be caused by electromagnetic fields emitted by radio-frequency (RF) and particularly microwave frequency signals moving from one location to another between components and on the circuit board by means of wires. Further, clock signals for controlling the components and to be transmitted by means of wires are also susceptible to disturbance signals. According to prior art, e.g. inside the above-mentioned card phone there is a flexible and electroconductive sealing used for shielding and which preferably forms a tight RF sealing when being pressed against the cover structures of the card phone.

The RF sealing exerts a force on the cover structure of the card-like wireless communication device, resulting in the bending of the cover structure and particularly warping of its wide planar cover surfaces. As a result of the bending, the thickness of this card-like wireless communication device is increased and it does not fit e.g. in the expansion card slot according to the PCMCIA standard or in the space reserved for the expansion card. Inserting the card-like wireless communication device by forcing it into the space reserved for it may result in mechanical damage of the cover structure or the sealing of the card, or sticking of the card in the expansion card slot.

SUMMARY OF THE INVENTION

The purpose of this invention is to eliminate the above-mentioned disadvantages and to present a remarkable improvement to the prior art. The cover structure of the wireless communication device according to the invention is characterized in that at least one cover surface is provided with at least one elongated bracing groove for increasing the dimensional stability of the cover surface. The method according to the invention in the manufacture of the cover structure of a wireless communication device is characterized in that at least one cover surface is provided with at least one elongated bracing groove for increasing the dimensional stability of the cover surface. The wireless communication device according to the invention is characterized in that at least one cover surface is provided with at least one elongated bracing groove for increasing the dimensional stability of the cover surface.

A remarkable advantage of the cover structure of the wireless communication device according to the invention is its simplicity and easy manufacture, wherein it can be easily made to comply with the requirements for the various card-like wireless communication devices. By the invention, it is possible to avoid preferably totally the use of various screws or supplementary structures, such as reinforcements or ribs of the cover structure, as well as glues for supporting and reinforcing the cover structure to increase its dimensional stability. By the invention it is also possible to arrange the support of the cover structure easily at that point of the cover structure which is subjected to a force causing e.g. bending.

Further, one advantageous embodiment of the invention has the advantage that the RF sealing of the card-like wireless communication device is improved as compared with prior art, because when the cover surface of the cover structure remains substantially planar, it maintains its contact with the RF sealing. Thus, for example, preferably no gaps through which disturbing electromagnetic fields could propagate are formed between the RF sealing and the cover structure by bending or warping.

On the basis of what has been presented above, it is also obvious that the invention can be used to improve the protective ability of also other sealings used in card-like wireless communication devices, wherein these sealings protect e.g. from dust and moisture. Further, it is obvious that by using the invention, bending and warping caused by forces occurring in connection with handling of card-like wireless communication devices and induced e.g. by compression will be decreased in relation to prior art. The invention has also the advantage that thinner cover structures can be used, wherein the space intended for components inside the card-like wireless communication device is increased.

BRIEF DESCRIPTION OF THE DRAWINGS

In the following, the invention will be described in more detail with reference to the appended drawings, in which.

DETAILED DESCRIPTION OF THE INVENTION

Figure 1:
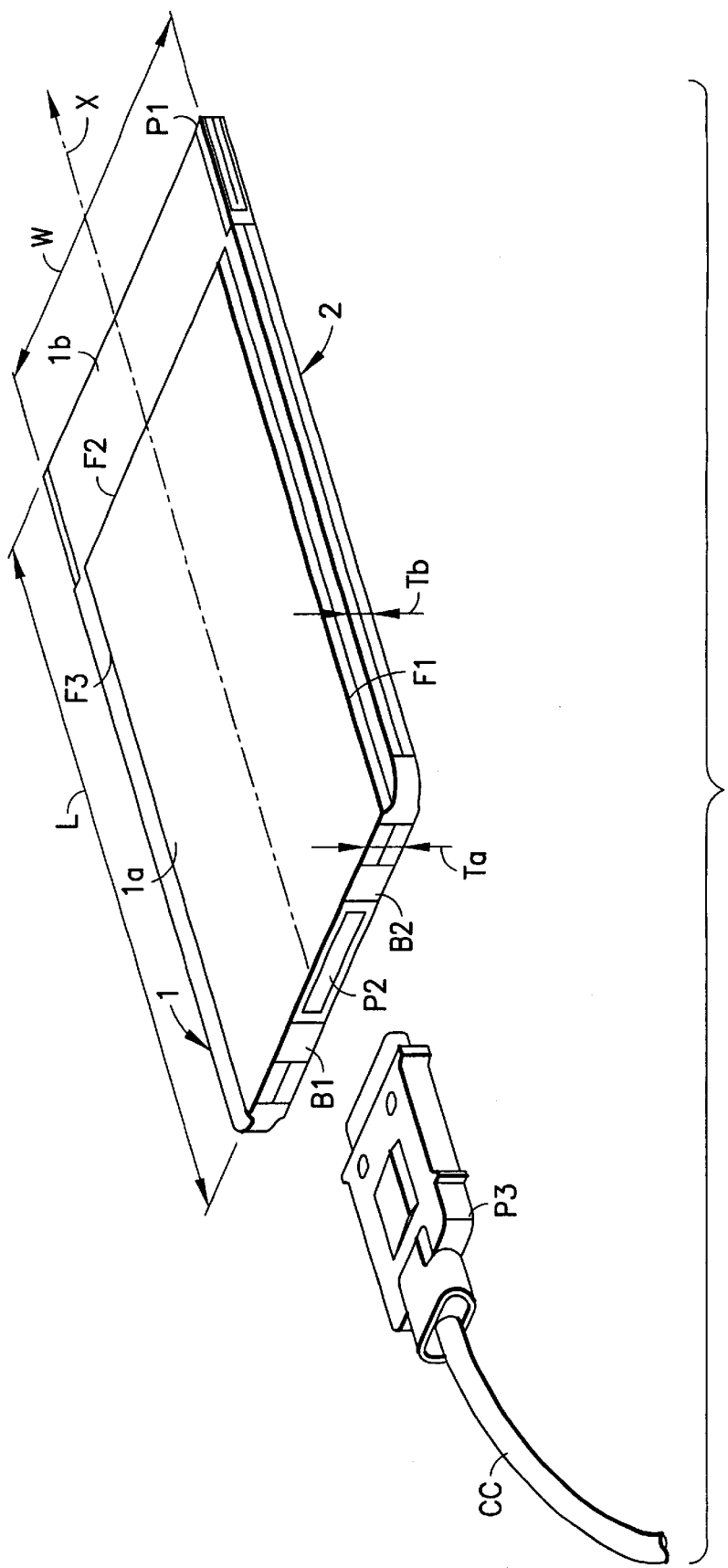
FIG. 1 shows a standard expansion card according to prior art in a perspective view.

FIG. 1 shows an expansion card according to prior art in a perspective view, wherein the expansion card is a PC card complying with the PCMCIA standard. According to the PCMCIA standard, the length L of the PC card is 85.6 mm and its width W is 54 mm. PC cards are divided into three types, wherein the thickness Ta of the PC card at the cover surface 1a can be 3.3 mm (type I), 5.0 mm (type II) or 10.5 mm (type III). PC cards are designed to be installed wholly inside the PC by a movement in the direction of the longitudinal axis X of the PC card, but so-called extended PC cards can be even 40 mm longer than regular PC cards. The PC card is equipped with a 68-pin connector P1 which connects the PC card e.g. with a PC. At the point of this connector P1 and at the point of the cover surface 1b of the cover structure 1 at the edge of the PC card, the thickness Tb of the PC card is 3.3 mm. A PC card used e.g. as a modem comprises also a connector P2, wherein the PC card can be connected via a cable CC to a public switched telephone network (PSTN) or a mobile station (MS). The cable CC is coupled to the connector P2 by a connector P3.

With reference to FIG. 1, the connectors P1 and P2 are usually fixed onto a circuit board (not shown in the figure) placed inside the PC card and containing also the components (such as IC) necessary for the functions of the PC card and the wirings for transmission of electric signals between the connectors P1, P2 and the components. However, the function of the PC card is prior art to a man skilled in the art, wherein an extensive description will be rendered unnecessary in this context. The size of the components to be placed inside the PC card is variable, wherein the thickness Ta of the PC card must be arranged according to these components. The PC card comprises usually two cover structures 1 and 2, which comprise further planar cover surfaces, such as 1a and 1b. These cover structures 1 and 2 are usually substantially identical in design and construction. The connectors P1 and P2, the circuit board, the required frame parts B1 and B2, as well as the cover structures 1 and 2 are assembled into a PC card as shown in FIG. 1. The assembly is assisted by gluing and bends and strip-like elements formed in the cover structures 1 and 2. The use of glue is possible at the cover surface 1b for fixing the cover structure 1 to the connector P1, but this is usually impossible at the cover surface 1a, because at this point there are components (such as IC) placed inside the PC card. The cover structures 1 and 2 are usually formed of a thin metal sheet with a substantially standard thickness, wherein the cover structures 1 and 2 are formed of the thin sheet by cutting, folding and forming by methods known as such, for example by the punching technique. In the manufacture, also the folds F1, F2 and F3 are formed between the cover surfaces 1a and 1b of the cover structure 1, the dimensions depending on the type of the PC card. If the thickness Ta is equal to the thickness Tb, i.e. 3.3 mm, no folds F1 to F3 are formed but the cover surfaces 1a and 1b form one uniform cover surface. The connectors P1, P2 and the frame parts B1, B2 are usually at least partly of plastic, such as polyethylene (PE).

Figure 2:
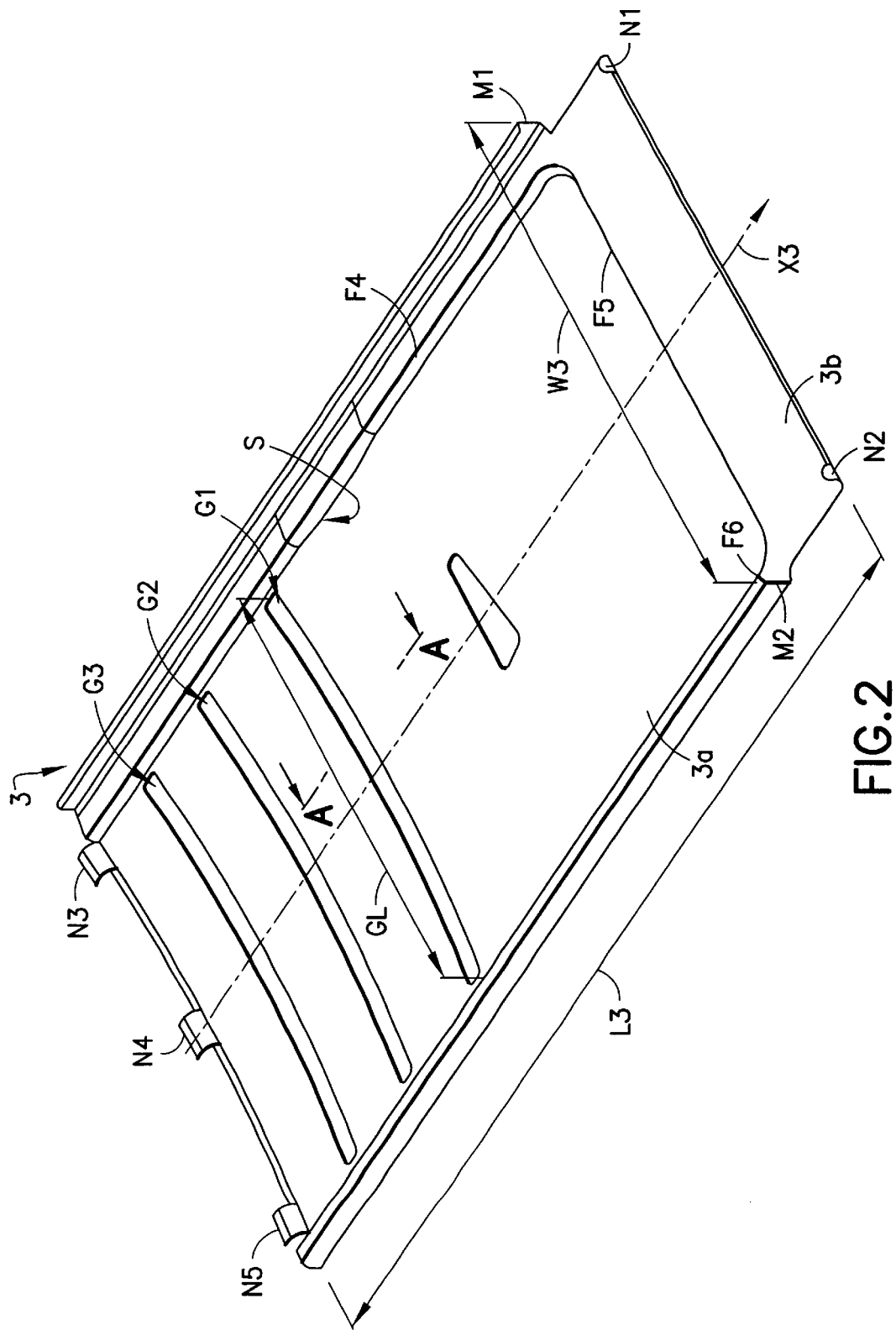
FIG. 2 shows an advantageous embodiment of the cover structure according to the invention in a perspective view.

FIG. 2 shows an advantageous embodiment for the cover structure 3 of a wireless communication device according to the invention. The cover structure 3 formed of a thin metal sheet comprises planar cover surfaces 3a and 3b, of which particularly 3a is wide and forms a substantial part of the cover structure 3. The cover structure 3 is arranged substantially equal to the cover structure 1 or 2 of a PC card according to the PCMCIA standard as shown in FIG. 1, wherein the width W3, length L3 and folds F4, F5 and F6 of the cover structure 3 are equal to the width W, length L, and folds F1, F2 and F3 of the PC card shown in FIG. 1. Further, the longitudinal axis X3 of the cover structure 3 is parallel with the longitudinal axis X of the PC card, the cover structure 3 being installed in the card-like wireless communication device. It should be noted that FIG. 2 shows the cover surface 3a of the cover structure 3, placed inside the card-like wireless communication device, but a corresponding cover surface is formed in the cover structure also on the side opposite to the cover surface 3a. Both of these cover surfaces are indicated in this description with the reference 3a, as shown in FIG. 4. Also the cover surface 3b as well as the cover surfaces 4a, 4b and 4c according to FIG. 3 are indicated in the same way.

With reference to FIG. 2, the cover structure 3 is provided with strip-like elements N1 to N5, by means of which the cover structure 3 is fixed and supported to the other structures, such as connectors and frame parts, of the card-like wireless communication device. By means of edge folds M1 and M2 formed in the cover structure 3, it is fixed also to the other structures, such as frame parts or other cover structures. One such cover structure is shown in FIG. 3 which illustrates another advantageous embodiment of the cover structure for a wireless communication device according to the invention. When connected with each other, the cover structures 3 and 4 form a construction corresponding to the structure consisting of the cover structures 1 and 2 of the expansion card shown in FIG. 1. With reference to FIG. 3, the cover structure 4 is arranged to partially correspond to the cover structure 1 or 2 of the PC card according to the PCMCIA standard as shown in FIG. 2, wherein the width W4 and the folds F7, F8 and F9 of the cover structure 4 correspond to the width W and the folds F1, F2 and F3 of the PC card. Moreover, the longitudinal axis X4 of the cover structure 4 is parallel to the longitudinal axis X of the PC card of FIG. 1, when the cover structure 4 is connected to a card-like wireless communication device. The length W4 of the cover structure 4 is arranged longer than the length W shown in FIG. 1 and the length W3 shown in FIG. 2. The cover structure 4 is provided with strip-like elements N6 to N2 for fixing and supporting the cover structure 4 to the other structures, such as connectors and frame parts, of the card-like wireless communication device. By means of edge folds M3, M4 provided in the cover structure 4, the cover structure 4 is fixed also to other structures, such as frame parts or other cover structure, for constituting the card-like wireless communication device. By means of a fold F10, the cover structure 4 is equipped with a wide planar cover surface 4c in alignment with the cover surface 4a. The perpendicular distance between these cover surfaces 4c and 4a is e.g. 0.1 mm, wherein the recess formed by the cover surface 4c can be used for placing e.g. an adhesive paper containing technical data on the card. The cover surface 4c is usually formed in a way that the thickness of the cover structure 4 is substantially the same as at the cover surfaces 4a, 4b and 4c. Of the recess forming the cover surface 4c, a bulge formed on the opposite side of the cover structure 4 is visible in FIG. 3.

Figure 3:
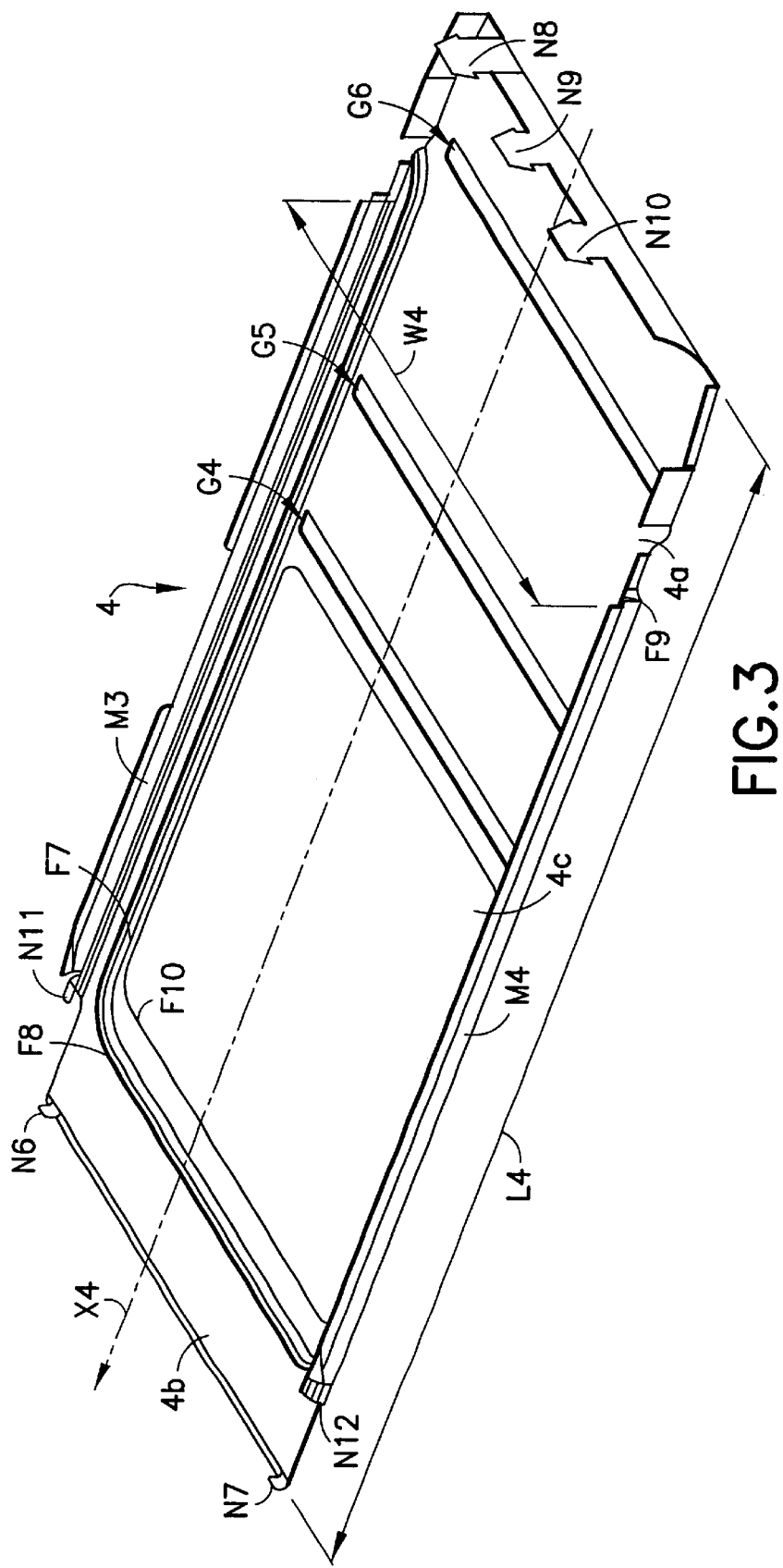
FIG. 3 shows another advantageous embodiment of the cover structure according to the invention in a perspective view.
Figure 4:
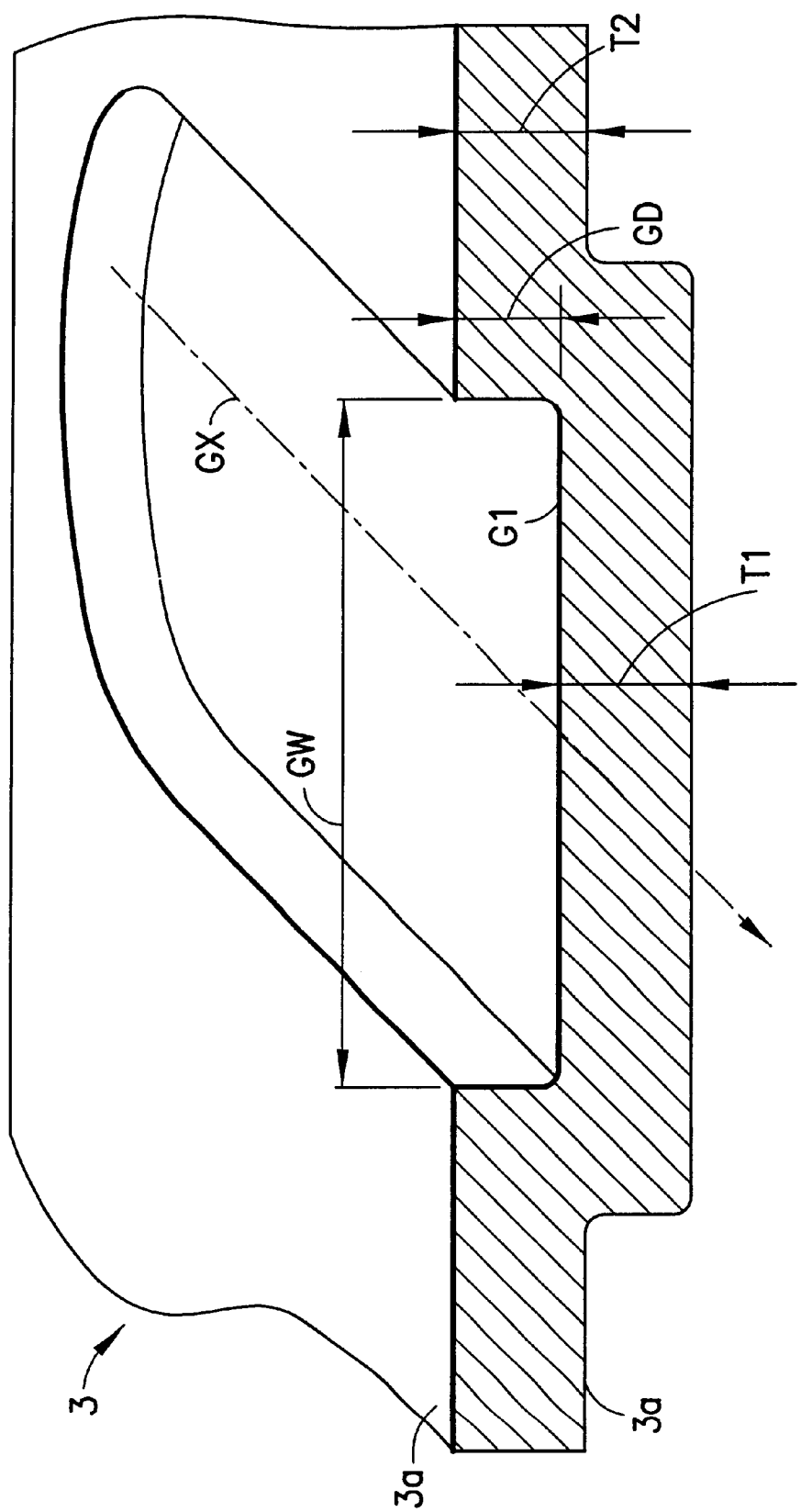
FIG. 4 shows a detail in the cover structure according to the invention as the section A—A of FIG. 2.

Further with reference to FIGS. 2 and 3, the cover structures 3 and 4 are provided with elongated bracing grooves G1 to G6. FIG. 4 shows a cross-sectional view of the bracing groove G1 in the cover structure 3 according FIG. 2, seen at the section A—A. FIG. 4 shows only the necessary part of the cover structure 3, and it should be noted that the cross-section of FIG. 4 corresponds substantially also to the cross-section of the elongated bracing grooves G2 to G6, but it is obvious that the width GW, depth GD and length GL of the bracing grooves G1 to G6 can vary among these different bracing grooves G1 to G6. The length GL of the bracing grooves G1 to G6 shown in FIG. 2 is usually manifold in relation to their width GW. With reference to FIG. 4, the bracing grooves G1 to G6 are arranged in a way that for example the thickness T2 of the cover structure 3 at the cover surface 3a is substantially equal to the thickness T1 of the cover structure 3 at the bracing groove G1. Providing the wide planar cover surface 3a with the bracing grooves G1 to G3 results in the cover structure 3 according to the invention, which bends less and whose cover surface 3a warps less in comparison with prior art, i.e. the result is increased dimensional stability of the cover structure 3. There is less warping of the cover surface 3a of the cover structure 3 in comparison with prior art, particularly in the plane perpendicular to the longitudinal axis GX of the bracing groove G1 and the cover surface 3a. This is because the substantially straight cross-section of the cover structure 3 is changed according to FIG. 4, with the result that the dimensional stability of the cover structure 3 is increased at the points provided with the bracing groove G1 shown in FIG. 4. By extending the bracing groove G1 substantially over the whole planar cover surface 3a of the cover structure 3, from its edge to the opposite edge, as shown in FIG. 2, the cover surface 3a is prevented from bending over its entire width. It is obvious that the cover surface 3a can also be provided with two or several bracing grooves formed in an array, wherein their longitudinal axes are placed substantially on the same line, but the cover surface 3a will thus warp at the point left between the bracing grooves. In this case, the warping of the cover surface 3a can be prevented by placing a new bracing groove by the side of this point. Further, the cover surface 3a can be provided with two or several arrays of bracing grooves in parallel so that a bracing groove is arranged by the point left between successive bracing grooves. It is also possible to provide the cover surface 3a with two intersecting bracing grooves in the form of an X, wherein these bracing grooves are e.g. at an angle of 45° to the longitudinal axis X3 of the cover structure 3.

According to FIG. 4, the profile of the bracing groove G1 is designed substantially in U-form, and the width of the bracing groove G1 is dimensioned so that no new wide cover surface is formed in the bracing groove G1. The thicknesses T1 and T2 of the cover structure 3 are arranged substantially the same, wherein the cover structure 3 can be formed of a thin sheet with a substantially standard thickness. Moreover, there will be no thinner points to weaken the cover structure 3. The ends of the bracing groove G1 are shaped substantially semi-circular, and in FIG. 2 the bracing grooves G2 and G3 are further designed to be curved in relation to the cover surface 3a, wherein the bracing grooves G2 and G3 can comply with the shape of the cover structure 3 in other respects. It is obvious that the depth GD and width GW of the bracing grooves G1 to G6 can vary in the direction of the longitudinal axes of the bracing grooves G1 to G6. In an advantageous embodiment of the method according to the invention, the bracing grooves G1 to G6 of the cover structure are formed by the punching technique. Thus the bracing grooves G1 to G6 are formed on the cover surface 3a by pressing with a press and a die, wherein a bulge is formed on the opposite side of the bracing groove G1 in the cover surface 3a, as shown in FIG. 4, and the thicknesses T1 and T2 are substantially the same.

The above-mentioned bending and warping can be caused by various force effects as mentioned earlier, and these can be exerted to the whole cover structure 3 or 4, or to the cover surface 3a, 4a or 4c. Thus it is obvious that if the wide cover surface 3a, 4a or 4c is not fixed e.g. by gluing, it will warp particularly in a direction perpendicular to the longitudinal axes X3 or X4, because the cover structures 3 and 4 are fixed and supported at their edge parts to the card-like wireless communication device by means of folds M1 to M4 in the direction of the longitudinal axes X3 and X4. Warping of the cover surfaces 3a, 4a and 4c is possible also in the plane perpendicular to these cover surfaces 3a, 4a and 4c and parallel to the longitudinal axes X3 and X4, because the cover structures 3 and 4 are fixed and supported at their edge parts to the card-like wireless communication device by means of strip-like elements N1 to N12 or gluings of the cover surfaces 3b and 4b. However, there is less warping in this plane, because the fastenings by the folds M1 to M4 prevent bending of the cover structures 3 and 4.

It is obvious that the matters presented in connection with the bracing groove G1 in the above description apply also to other bracing grooves G2 to G6, and that bracing grooves can be provided, if necessary, in all the cover surfaces 3a, 3b, 4a, 4b and 4c in various numbers and placed in said cover surfaces at points different from those shown in FIGS. 2 and 3. The shapes of the strip-like parts, folds and cover surfaces of the cover structures in the card-like wireless communication devices can vary, as well as warping caused by force effects, but it will be obvious from the description of this invention how the cover structure can be designed to improve its dimensional stability, e.g. to prevent changes in the dimensions caused by bending within the scope of the claims. Further, it is obvious that the bracing groove can be placed on both sides of the cover structures 3 and 4, wherein, for example of the bracing groove G1 formed on the cover surface 3a in FIG. 2, a bulge according to FIG. 4 formed on the cover surface 3a under the cover structure 3 is visible, and for example of the bracing groove G2, a groove according to FIG. 4 is visible. In the embodiments of FIGS. 2 and 3, a bulge formed on the cover surfaces 3a and 4a is visible of the bracing grooves G1 to G6, wherein the bracing grooves G1 to G3 and G4 to G6 are formed on the same side of the cover surfaces 3a and 4a. The cover structures 3 and 4 shown in FIGS. 2 and 3 constitute the cover structures 3 and 4 of a wireless communication device CP according to the invention shown in FIG. 5.

Figure 5:
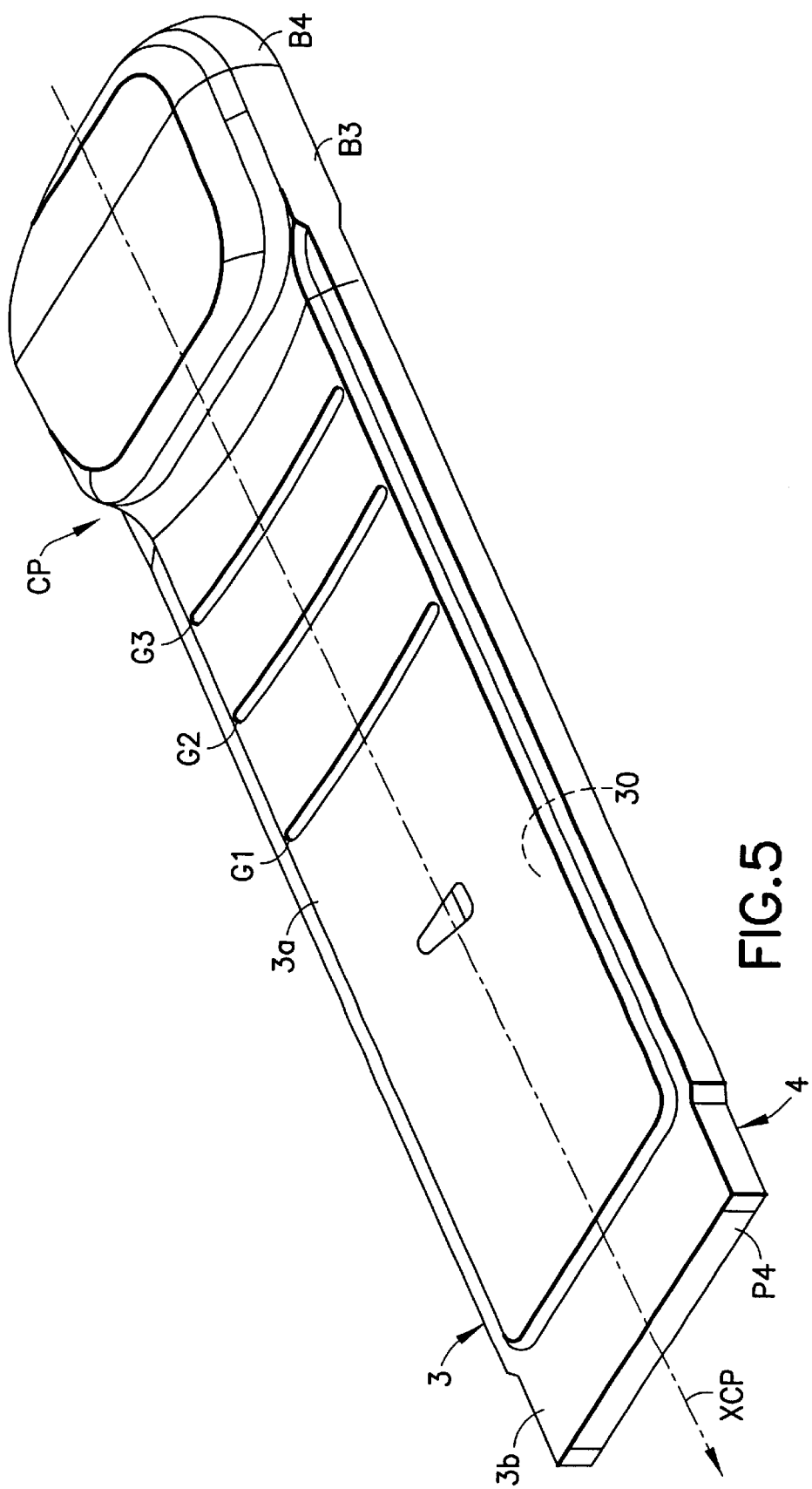
FIG. 5 shows an advantageous embodiment of the wireless communication device according to the invention in a perspective view.

FIG. 5 shows an advantageous embodiment of the wireless communication device according to the invention, wherein the wireless communication device CP is at least partly arranged as an expansion card complying with the PCMCIA standard. The cover structures 3 and 4 of the card-like wireless communication device CP correspond to the cover structures 3 and 4 shown in FIGS. 2 and 3. The wireless communication device CP is arranged as a card phone mentioned above, wherein the cover structure 4 of the wireless communication device CP is provided with an opening S shown in FIG. 2 for the subscriber identity module (SIM) of the card phone. The wireless communication device CP comprises further a connector P4 and frame parts B3 and B4, wherein the circuit board, RF sealing 30 and the transmitter/receiver, with the antenna, of the wireless communication device CP are placed inside the wireless communication device CP. These components, known as such, are not shown in FIG. 5. The RF sealing 30 can have a varying cross-section, and it can be placed circumferentially around the component or components to be shielded on the circuit board. With the electroconductive cover structure, the RF sealing forms a protection from disturbing electromagnetic fields. The cover structures 3 and 4 can be made also of a plastic material, wherein an electroconductive coating must be provided on the inner surface of the cover structure. The electroconductive RF sealing 30 is compressed at least partly between the cover structure 3 or 4 of the wireless communication device CP and the circuit board placed inside the wireless communication device CP, which exerts a force bending the cover structure 3 or 4, particularly its wide cover surface 3a, 4a or 4c. When the cover structure 3 or 4 of the wireless communication device CP complies with the invention presented above, the above-mentioned disadvantages caused by bending or warping of the cover surface 3a, 4a or 4c are preferably totally eliminated.

FIG. 5 shows the bracing grooves G1 to G3 of the cover structure 3, but the cover structure 4 of the card-like wireless communication device CP is provided also with the bracing grooves G4 to G6 as shown in FIG. 3. The bracing grooves G1 to G6 are arranged transverse to the longitudinal axis XCP of the card-like wireless communication device CP, wherein there is less warping the plane transverse to the longitudinal axis XCP in comparison with prior art. The cover structure can also be provided with bracing grooves when the cover structure or any of its cover surfaces has an intentionally curved or rounded design. It is obvious that e.g. the depth GD of the bracing groove G1 shown in FIG. 4 can vary in the direction of its longitudinal axis GX, wherein a contact can be made by means of the bracing groove G1 between the RF sealing and the cover surface with a varying design. It is also possible that the design of the RF sealing varies. Further, it is obvious that the wireless communication device CP can comprise more than two cover structures or only one cover structure to be placed on the frame structure. According to markings in FIGS. 4 and 2, in an advantageous embodiment of the invention shown in FIG. 5, the length GL of the bracing grooves G1 to G6 is preferably 42 to 44 mm, wherein the bracing grooves extend substantially over the cover surfaces 4a and 3a, the width GW is preferably 1 to 3 mm, wherein no wide new cover surface is formed in the bracing groove G1 to G6, and the depth GD is preferably 0.1 to 0.3 mm, wherein a transformation of the edges of the bracing grooves will not substantially weaken the cover structure and the depth GD of the bracing grooves is less than the thickness of the cover structure 3.

It is obvious that the invention is not limited solely to the embodiments presented above but it can be modified within the scope of the claims.

What is claimed is:

1. A wireless communication device arranged at least partly as a standard expansion card, the device having at least one cover overlying RF sealing material, which is at least partially compressed by said cover, said cover being provided with at least one elongated bracing groove extending across a major surface of said cover for increasing the dimensional stability of said cover to avoid expansion of the wireless communication device.

2. The wireless communication device according to claim 1 wherein said cover comprise a thin metal sheet having the bracing groove formed therein.

3. The wireless communication device according to claim 1, wherein the depth (GD) of each bracing groove is smaller than the thickness (T2) of the cover at the major cover surface.

4. The wireless communication device according to claim 1 wherein each bracing groove is arranged transverse to a longitudinal axis of the wireless communication device.

5. The wireless communication device according to claim 1, wherein the profile of each bracing groove is designed substantially in U-form in a cross-sectional plane transverse to a longitudinal axis of the bracing groove, and that the length (GL) of the bracing groove is preferably 42 to 44 mm, the width (GW) is preferably 1 to 3 mm and the depth (GD) is preferably 0.1 to 0.2 mm.

6. The wireless communication device according to claim 1, wherein the depth (GD) of the bracing groove is smaller than the thickness (T2) of the cover structure at the at least one cover surface.

7. The wireless communication device according to claim 1, including at least one additional cover arranged in opposition to said at least one cover with said RF sealing material being at least partially compressed by said covers.

* * * * *